United States Patent
Cheah et al.

(10) Patent No.: US 9,721,878 B2
(45) Date of Patent: Aug. 1, 2017

(54) HIGH DENSITY SECOND LEVEL INTERCONNECTION FOR BUMPLESS BUILD UP LAYER (BBUL) PACKAGING TECHNOLOGY

(71) Applicants: Bok Eng Cheah, Bayan Lepas (MY); Shanggar Periaman, Penang (MY); Kooi Chi Ooi, Bayan Lepas (MY)

(72) Inventors: Bok Eng Cheah, Bayan Lepas (MY); Shanggar Periaman, Penang (MY); Kooi Chi Ooi, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 72 days.

(21) Appl. No.: 13/631,392

(22) Filed: Sep. 28, 2012

(65) Prior Publication Data

US 2014/0091442 A1    Apr. 3, 2014

(51) Int. Cl.
*H01L 23/48*    (2006.01)
*H01L 23/498*    (2006.01)
(Continued)

(52) U.S. Cl.
CPC ...... *H01L 23/49811* (2013.01); *H01L 21/561* (2013.01); *H01L 21/568* (2013.01); *H01L 23/5389* (2013.01); *H01L 24/19* (2013.01); *H01L 24/20* (2013.01); *H01L 25/105* (2013.01); *H01L 24/48* (2013.01); *H01L 2224/04105* (2013.01); *H01L 2224/12105* (2013.01); *H01L 2224/48091* (2013.01);
(Continued)

(58) Field of Classification Search
CPC .................. H01L 23/5389; H01L 23/49811

USPC ............... 257/777, 686, E23.145, 780
See application file for complete search history.

(56) References Cited

U.S. PATENT DOCUMENTS 6,121,975 A * 9/2000 Mungenast et al. .......... 345/588
7,547,975 B2 * 6/2009 Takaya ................ H01L 23/5389
                                                              257/778

(Continued)

OTHER PUBLICATIONS

Cheah, B. E., et al., "Study of Dielectric Material Property Impact on Insertion Loss for Advanced Packaging Solutions", Consumers Electronics—Taiwan (ICCE-TW), 2015 IEEE International Conference, (Jun. 2015), 134-135.

(Continued)

*Primary Examiner* — Nitin Parekh
(74) *Attorney, Agent, or Firm* — Blakely, Sokoloff, Taylor & Zafman LLP

(57) ABSTRACT

An apparatus including a die including a device side; and a build-up carrier including a body including a plurality of alternating layers of conductive material and dielectric material disposed on the device side of the die, an ultimate conductive layer patterned into a plurality of pads or lands; and a grid array including a plurality of conductive posts disposed on respective ones of the plurality of pads of the ultimate conductive layer of the body, at least one of the posts coupled to at least one of the contact points of the die through at least a portion of the conductive material of the body. A method including forming a body of a build-up carrier including a die, the body of the build-up carrier including an ultimate conductive layer and forming a grid array including a plurality of conductive posts on the ultimate conductive layer of the body.

12 Claims, 8 Drawing Sheets

(51) Int. Cl.
  *H01L 21/56* (2006.01)
  *H01L 23/538* (2006.01)
  *H01L 25/10* (2006.01)
  *H01L 23/00* (2006.01)

(52) U.S. Cl.
  CPC ............... *H01L 2224/48227* (2013.01); *H01L 2224/73265* (2013.01); *H01L 2225/06568* (2013.01); *H01L 2225/1035* (2013.01); *H01L 2225/1058* (2013.01); *H01L 2924/00014* (2013.01); *H01L 2924/12042* (2013.01); *H01L 2924/15311* (2013.01); *H01L 2924/181* (2013.01); *H01L 2924/18162* (2013.01); *H01L 2924/30107* (2013.01)

(56) References Cited

U.S. PATENT DOCUMENTS

| | | | | |
|---|---|---|---|---|
| 7,767,496 B2* | 8/2010 | Shim, II | ................ | H01L 21/568 257/E21.503 |
| 8,004,074 B2* | 8/2011 | Mori et al. | ..................... | 257/686 |
| 8,410,614 B2* | 4/2013 | Kunimoto | ..................... | 257/774 |
| 8,659,151 B2* | 2/2014 | Ino | ................ | 257/737 |
| 8,692,132 B2* | 4/2014 | Ito | ..................... | H01L 23/5389 174/252 |
| 8,901,724 B2* | 12/2014 | Guzek | .................. | H01L 21/568 257/686 |
| 2007/0035033 A1* | 2/2007 | Ozguz et al. | ................. | 257/777 |
| 2007/0178622 A1* | 8/2007 | Liu | ..................... | H01L 23/3128 438/106 |
| 2008/0119004 A1* | 5/2008 | Burch | ................... | H01L 21/561 438/51 |
| 2008/0246126 A1* | 10/2008 | Bowles | .............. | H01L 23/3114 257/659 |
| 2009/0008765 A1* | 1/2009 | Yamano | .............. | H01L 21/6835 257/690 |
| 2012/0001306 A1* | 1/2012 | Wang et al. | .................. | 257/666 |
| 2012/0319295 A1* | 12/2012 | Chi et al. | ..................... | 257/774 |
| 2013/0105991 A1* | 5/2013 | Gan et al. | ..................... | 257/777 |
| 2014/0124242 A1* | 5/2014 | Ito | .......................... | H05K 1/111 174/250 |

OTHER PUBLICATIONS

Lo, L., et al., "Package Technology Evaluation and Optimization for High-Speed Applications", 2014 IEEE International Symposium on Electromagnetic Compatibility (EMC), (Aug. 2014), 625-630.

* cited by examiner

UV LIGHT

HIGH DENSITY SECOND LEVEL INTERCONNECTION FOR BUMPLESS BUILD UP LAYER (BBUL) PACKAGING TECHNOLOGY

BACKGROUND

Field

Packaging for microelectronic devices.

Description of Related Art

Microelectronic packaging technology, including methods to mechanically and electrically attach a silicon die (e.g., a microprocessor) to a substrate or other carrier continues to be refined and improved. Bumpless Build-Up Layer (BBUL) technology is one approach to a packaging architecture. Among its advantages, BBUL eliminates the need for assembly, eliminates prior solder ball interconnections (e.g., flip-chip interconnections), reduces stress on low-k interlayer dielectric of dies due to die-to-substrate coefficient of thermal expansion (CTE mismatch), and reduces package inductance through elimination of core and flip-chip interconnect for improved input/output (I/O) and power delivery performance.

With shrinking electronic device sizes and increasing functionality, integrated circuit packages will need to occupy less space. One way to conserve space is to combine a device or package on top of a package (e.g., package-on-package (POP)). Such an approach may contribute to an undesirable increase in z-height of the compounded structure.

DETAILED DESCRIPTION

Figure 1:
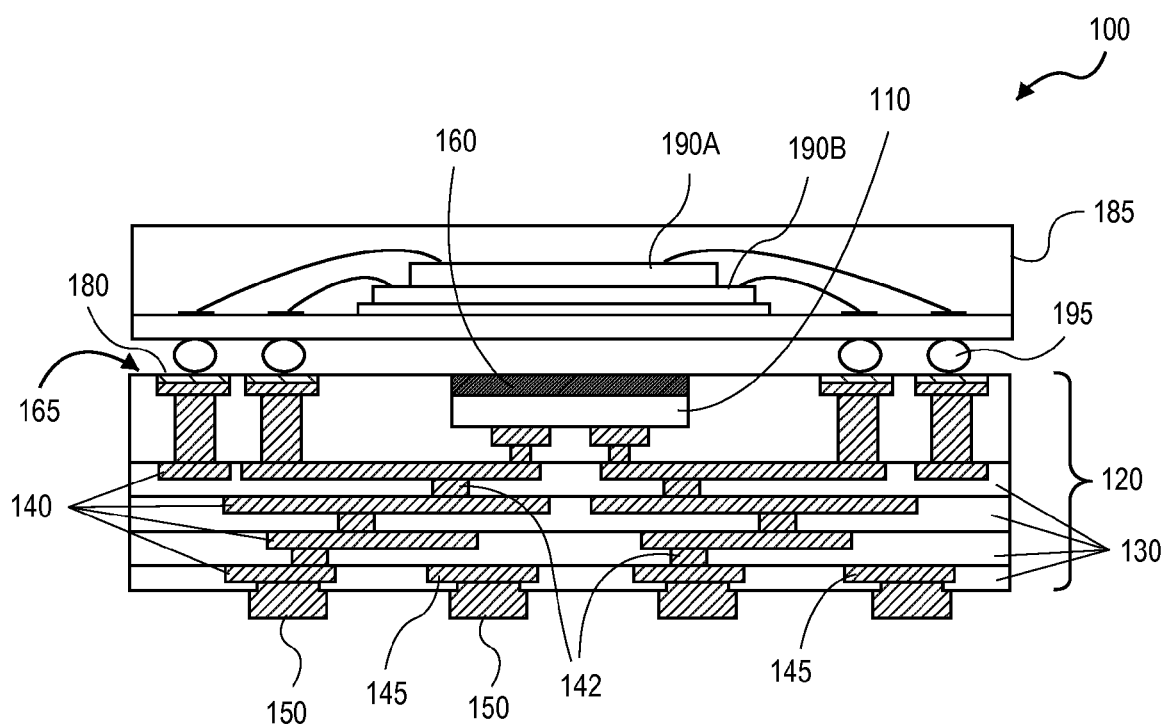
FIG. 1 shows a cross-sectional view one embodiment of a portion of a microelectronic package including a die embedded in a build-up carrier.

FIG. 1 shows a cross-sectional view of a microelectronic package according to one embodiment. As illustrated in FIG. 1, microelectronic package 100 utilizes bumpless build-up layer (BBUL) technology. Microelectronic package 100 includes carrier 120 (a build-up carrier) and die 110, such as a microprocessor die, embedded in carrier 120 device side down (as viewed). Die 110 and carrier 120 are in direct physical contact with each other (e.g., there are no solder bumps connecting die 110 to carrier 120).

In one embodiment, die 110 is a silicon die or the like having a thickness of approximately 150 micrometers (μm). In another example, die 110 can be a silicon die or the like that has a thickness less than 150 μm such as 50 μm to 150 μm. It is appreciated that other thicknesses for die 110 are possible. In another embodiment, die 110 may be a through silicon via (TSV) die with contacts on a back side of die 110.

Referring to FIG. 1, carrier 120 includes multiple build-up layers including dielectric layers 130 (four shown) of, for example, ABF and conductive layers 140 (four shown) of, for example, copper or a copper alloy (connected with conductive vias 142 or the like) that provide connectivity to the die (power, ground, input/output, etc.) through lands 145 that define the ultimate conductive layer 140 (i.e., the lower most conductive layer as viewed). Die 110 is directly connected to lands 145 or conductive vias of carrier 120 at its device side. In one embodiment, carrier 120 includes conductive posts 150 that are connected to and extend from lands 145. Posts 150 define a grid array (a metal grid array) and may extend over an entire package surface of package 100 or some lesser portion of the surface.

As shown in FIG. 1, dielectric material surrounds the lateral side walls of die 110 of microelectronic package 100. Overlying a back side of die 110 is adhesive layer 160 of, for example, a die backside film (DBF) polymer, epoxy based adhesive with or without fillers.

FIG. 1 also shows contacts 180 on surface 165 (top surface as viewed) of carrier 120. Contacts 180 are connected to one or more conductive layers 140 of carrier 120. Contacts 180 provide an additional routing opportunity (additional to posts 150) to route signals to or from microelectronic package 100. Contacts 180 allow additional interconnect points for the package as well as contact points for a second device, such as a memory device or microprocessor (possibly encompassed in a package) to be electrically connected to carrier 120 to form microelectronic package 100 or a package-on-package ("POP") structure. FIG. 1 shows package 185 including die 190A and die 190B connected to carrier 120 through solder connections 195.

Figure 2:
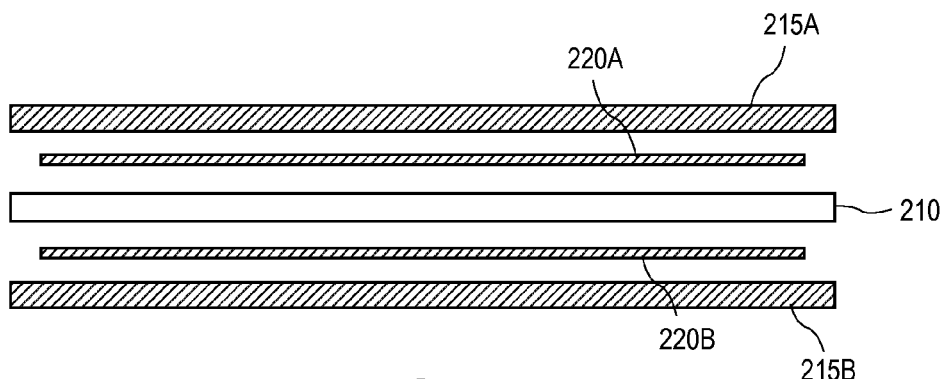
FIG. 2 shows a cross-sectional exploded side view of a sacrificial substrate with sacrificial copper foils attached to opposite sides thereof.

FIG. 2 describes one embodiment for forming a microelectronic package, such as microelectronic package 100 (FIG. 1). Referring to FIG. 2, FIG. 2 shows an exploded cross-sectional side view of a portion of sacrificial substrate 210 of, for example, a prepeg material including opposing layers of copper foils 215A and 215B that are separated from sacrificial substrate 210 by shorter copper foil layers 220A and 220B, respectively. Copper foils 215A and 215B tend to stick to the shorter foils based on vacuum.

Figure 3:
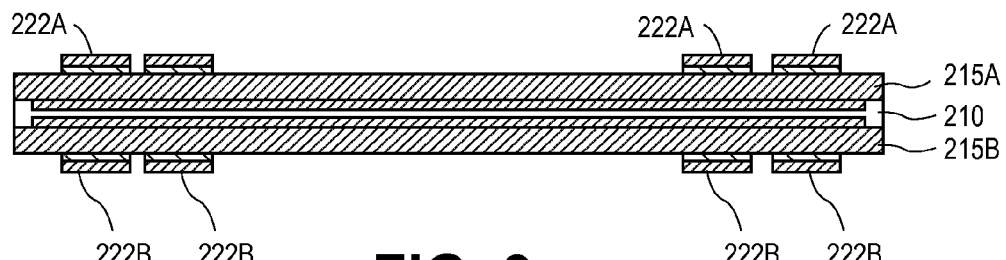
FIG. 3 show the structure of FIG. 2 following the introduction of contacts on the copper foils and a dielectric layer over the contacts in a process of forming one portion of the carrier.

FIG. 3 shows the structure of FIG. 2 following the introduction and patterning of contacts on copper foil 215A and copper foil 215B, respectively. FIG. 3 shows contacts 222A and 222B formed on copper foil 215A and 215B, respectively. In one embodiment, contacts 222A and 222B include a first layer adjacent copper foil 215A and copper foil 215B, respectively, of a gold-nickel alloy and a second layer overlying a second layer of copper or a copper alloy overlying the gold-nickel alloy. Contacts 222A and 222B may be formed by deposition (e.g., plating, a sputter deposition, etc.) and patterning at a desired location for possible electrical contact with a secondary device or package.

Figure 4:
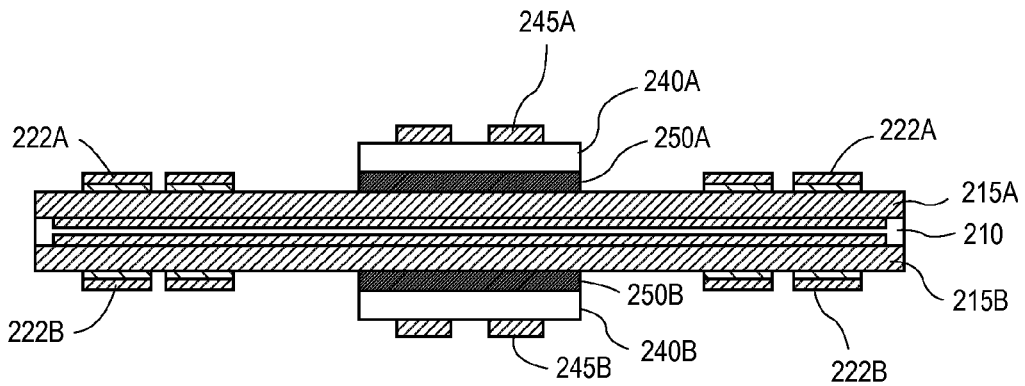
FIG. 4 shows the structure of FIG. 3 following the introduction of dice on opposite sides of the structure.

FIG. 4 shows the structure of FIG. 3 following the mounting of die 240A and die 240B on opposite sides of the structure. As shown in FIG. 4, die 240A is connected by adhesive 250A and die 240B is connected by adhesive 250B. A suitable adhesive material for 250A and adhesive 250B is DBF. Die 240A and die 240B are positioned device side up (device side facing away from each copper foil). On a device side of each die, FIG. 4 shows that conductive pillars 245A and 245B are connected to the contact points of die 240A and die 240B, respectively. Pillars 245A and pillars 245B may be fabricated at the die fabrication stage.

Figure 5:
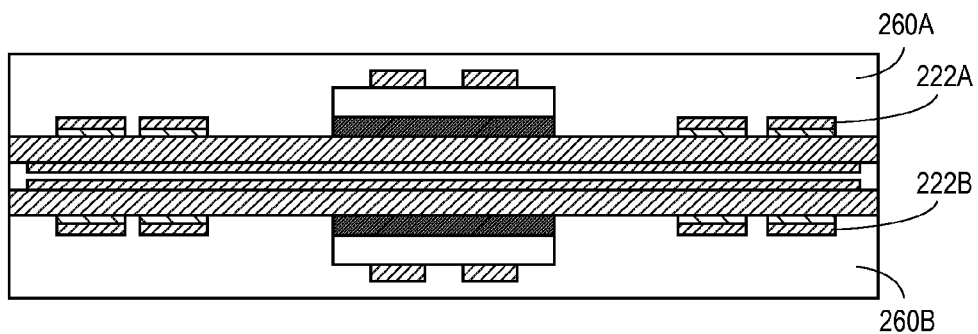
FIG. 5 shows the structure of FIG. 4 following the introduction of dielectric material on the dice.

FIG. 5 shows the structure of FIG. 4 following the introduction of a dielectric layer on each side of the structure. FIG. 5 shows dielectric layer 260A and dielectric layer 260B. In one embodiment, dielectric layer 260A and dielectric layer 260B are each an ABF dielectric material possibly including a filler that have been described for use in forming a BBUL package. One method of introduction of an ABF material is as a film that is laid on the respective dice, the contacts and copper foils.

Figure 6:
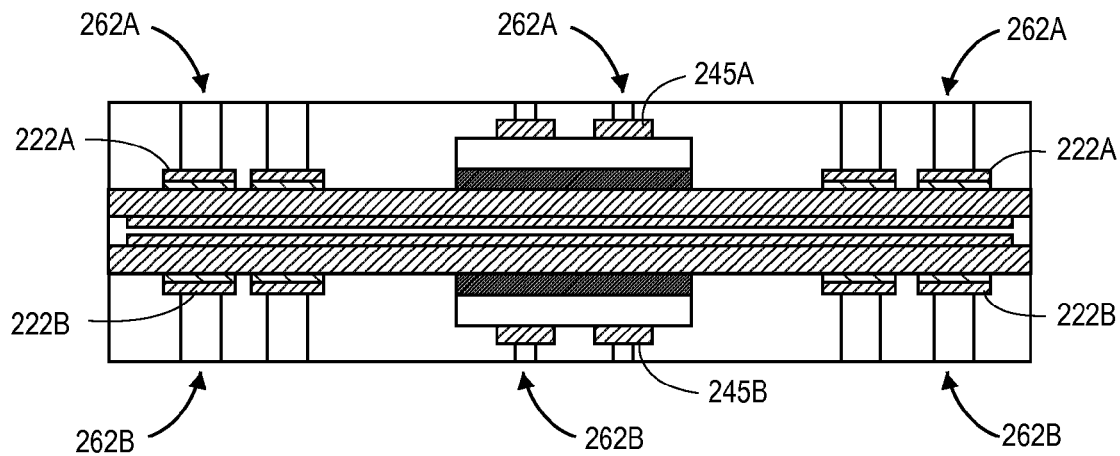
FIG. 6 shows the structure of FIG. 5 following the opening of vias in the dielectric layers.

FIG. 6 shows the structure of FIG. 5 following the opening of vias 262A and 262B in dielectric layer 260A and dielectric layer 260B to contacts 222A, contacts 222B, pillars 245A and pillars 245B. In one embodiment, such openings or vias may be achieved by a laser process.

Figure 7:
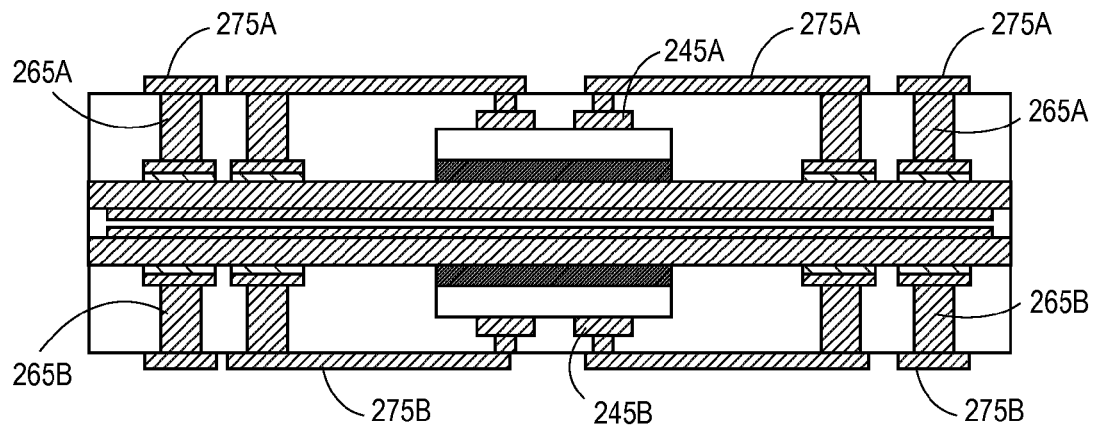
FIG. 7 shows the structure of FIG. 6 following the introduction of a conductive material in the vias and the patterning of a conductive layer or line on the dielectric.

FIG. 7 shows the structure of FIG. 6 following the patterning of a conductive line or layer 275A and conductive line or layer 275B on dielectric layer 260A and dielectric layer 260B, respectively, and conductive vias 265A and 265B formed through the respective dielectric layers to contacts 222A and contacts 222B, respectively. Conductive vias are also formed to pillars 245A and pillars 245B to contact points on a device side of die 240A and die 240B. A suitable material for patterned conductive line or layer 275A/275B and for conductive vias 265A/265B is copper deposited, for example, by an electroplating process.

Figure 8:
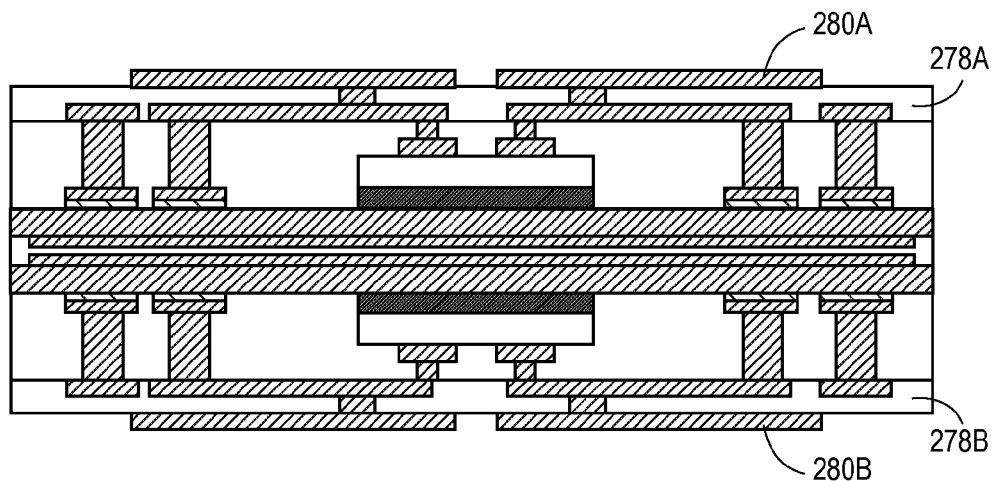
FIG. 8 shows the structure of FIG. 7 following the introduction of successive layers of dielectric material and conductive material (second layer) on opposite sides of the structure.
Figure 9:
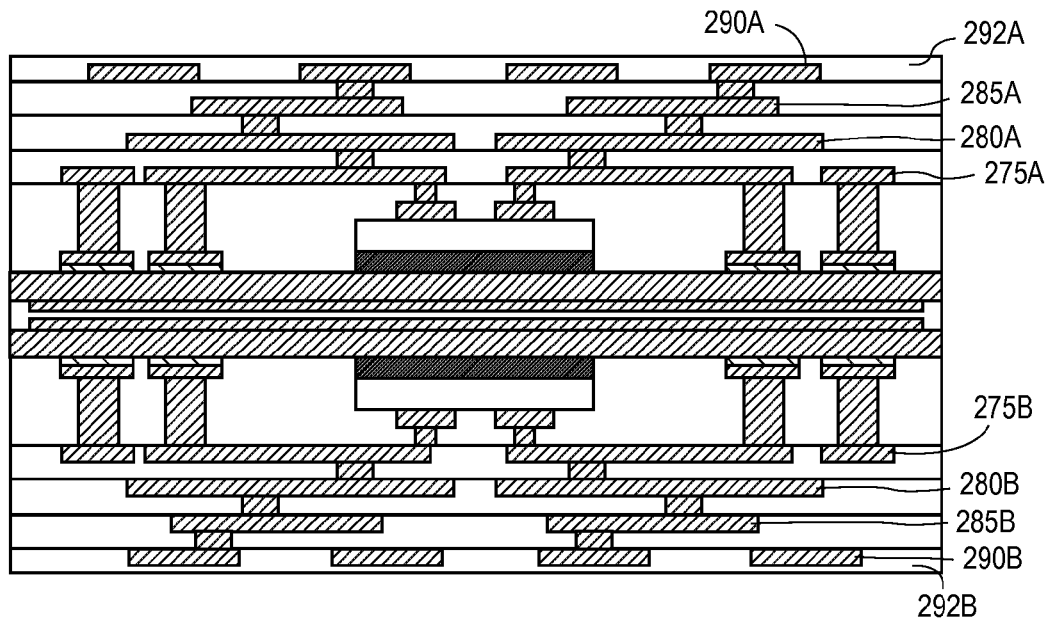
FIG. 9 shows the structure of FIG. 8 following the introduction of successive layers of dielectric material and conductive material (third and fourth layers) on opposite sides of the structure with the ultimate conductive material layer defined by pads or lands and a dielectric material on the ultimate conductive material layer.

FIG. 8 shows the structure of FIG. 7 following the patterning of an additional level of conductive line or layer of a carrier. FIG. 8 shows conductive line or layer 280A and conductive line or layer 280B separated from conductive line or layer 275A and 275B, respectively by dielectric layer 278A and 278B, respectively (e.g., an ABF film). A typical BBUL package may have four to six levels of conductive lines or traces similar to conductive lines or layers 275A, 275B, 280A and 280B separated from adjacent lines by dielectric material (e.g., ABF film). Connections between the layers is made, in one embodiment, by conductive vias (e.g., copper filled vias) formed by laser drilling the vias and depositing a conductive material in the vias. FIG. 9 shows the structure following the introduction and patterning of conductive lines or layers 285A and 285B (third level) and conductive lines or layers 290A and 290B (fourth level). In this embodiment, conductive lines or layers 290A and 290B are an ultimate or top level of the carrier body. FIG. 9 also shows dielectric material 292A and dielectric material 292B on, for example, an ABF laminated film overlying conductive layer or lines 292A and 292B, respectively. In one embodiment, lines or layers 290A and 290B are patterned into lands or pads for a packaging implementation.

Figure 10:
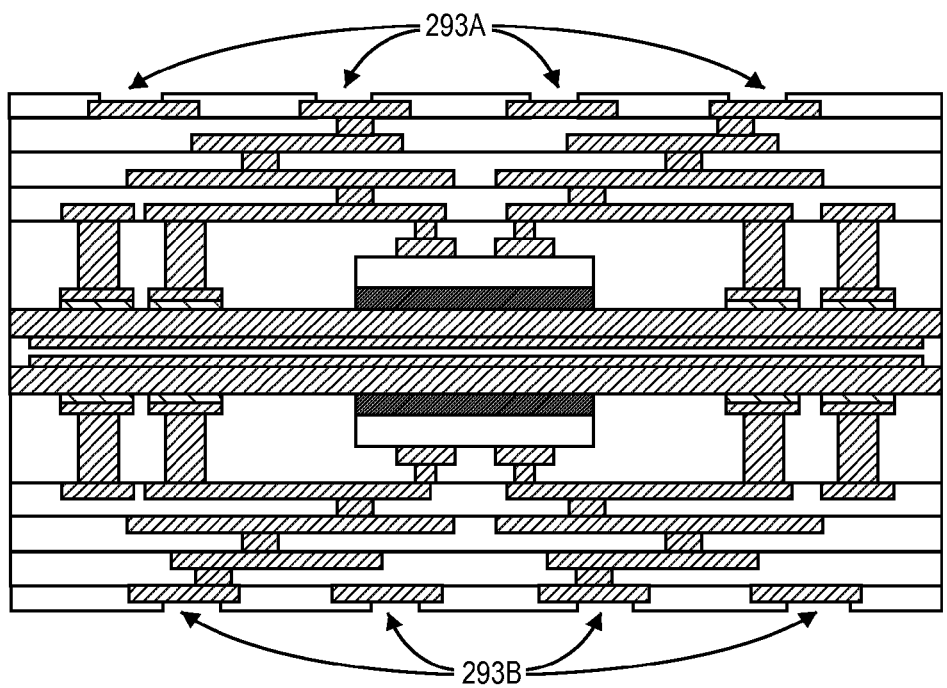
FIG. 10 shows the structure of FIG. 9 following the formation of openings to respective ones of the pads or lands of the ultimate conductive material layer on opposite sides of the structure.

FIG. 10 shows the structure of FIG. 9 following the formation of openings to respective ones of the conductive pads that define conductive layers or lines 290A and 290B. In one embodiment, opening 293A and opening 293B are formed by a laser via process. Representative dimensions for openings 293A and 293B are on the order of 50 microns (μm) to 200 μm.

Figure 11:
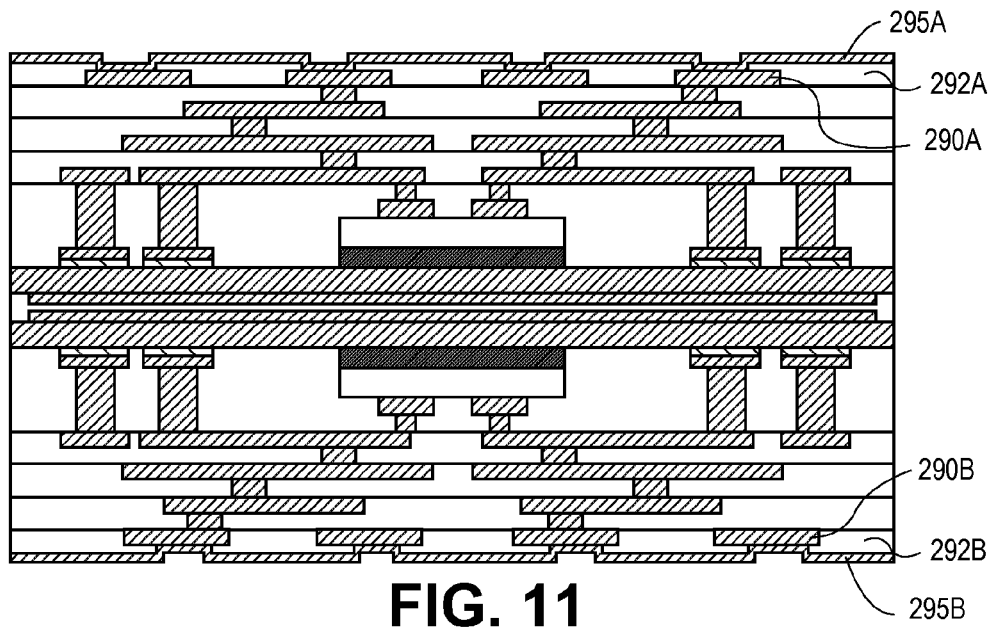
FIG. 11 shows the structure of FIG. 10 following the introduction of a conductive material layer on opposite sides of the structure.

FIG. 11 shows the structure of FIG. 10 following the introduction of a conductive material layer on the body of the build-up carriers. FIG. 11 shows conductive material 295A and conductive material 295B of, for example, a copper material introduced to a representative thickness on the order of 0.5 μm to 1 μm by an electroless plating process. In this embodiment, the respective layers of conductive material are introduced on dielectric material 292A/292B and exposed portions of conductive lines or layers 290A/290B. In another embodiment, the respective layers of conductive material may be introduced only on the exposed portions of conductive lines or layers 290A/290B.

Figure 12:
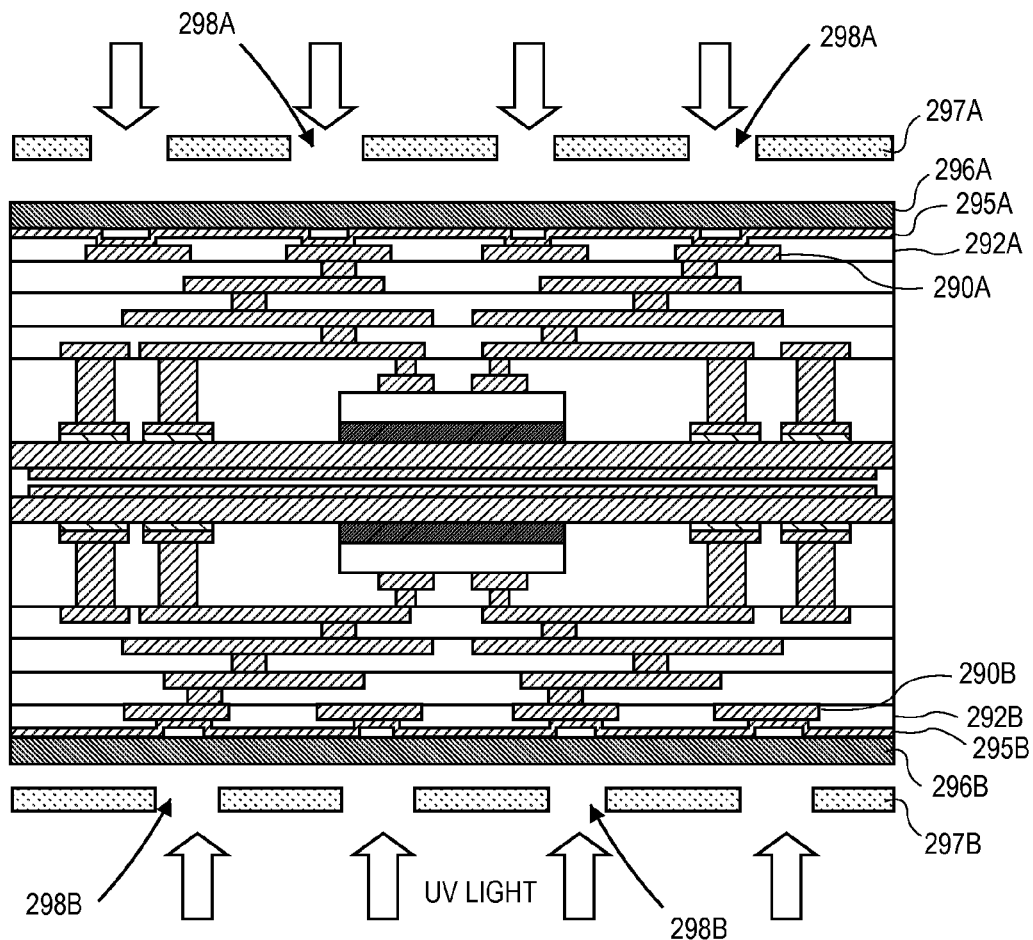
FIG. 12 shows the structure of FIG. 11 following the introduction of a sacrificial material layer on opposite sides of the structure and developing of the sacrificial material layer.

FIG. 12 shows the structure of FIG. 11 following the introduction of a sacrificial material on the body of the build-up carriers. FIG. 12 shows sacrificial material layer 296A and sacrificial material layer 296B of, for example, a dry film photoresist material as a blanket on the body. In one embodiment, sacrificial material layers 296A and 296B are introduced (e.g., deposited) to a thickness selected for a desired height dimension of posts of a grid array (discussed below). A representative thickness range is on the order of 50 μm to 100 μm.

Following the introduction of sacrificial material layers 296A and 296B, FIG. 12 shows mask 297A and mask 297B patterned with openings 298A and openings 298B over openings 293A and 293B as dielectric material 292A and dielectric material 292B. A light source, such as an ultraviolet light source, may be utilized to expose and/or develop photoresist material. A dimension(s) of openings 298A/298B will determine a dimension of a post (e.g., a diameter of a post). In one embodiment, a representative diameter of openings 298A and 298B is on the order of 50 μm to 200 μm.

Figure 13:
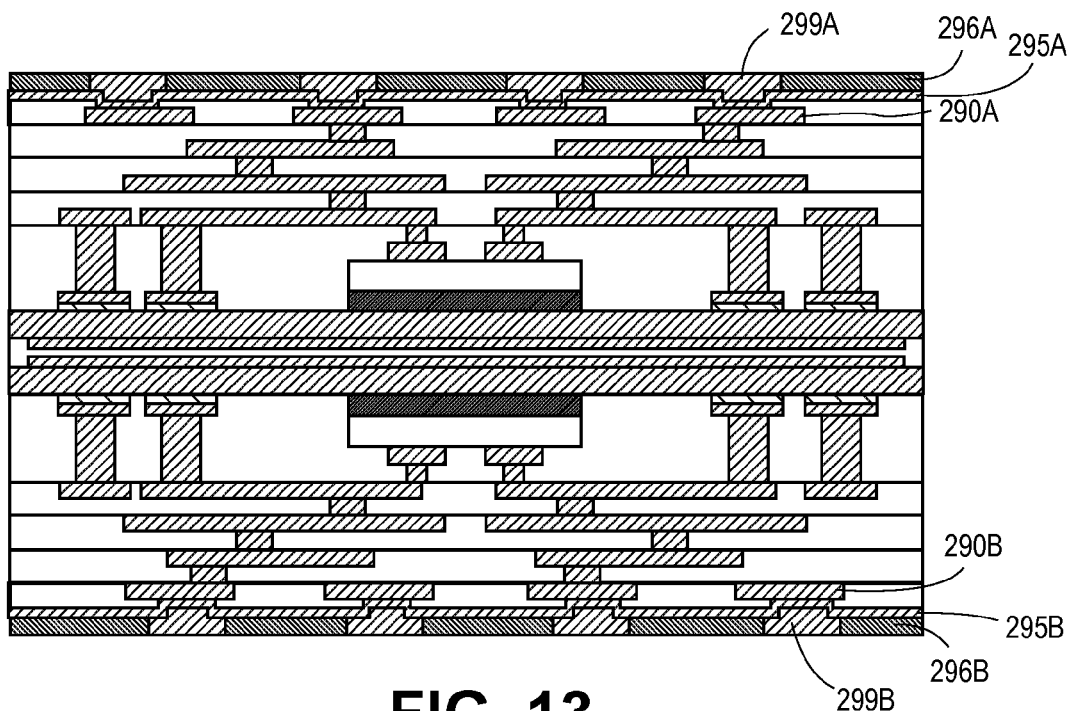
FIG. 13 shows the structure of FIG. 12 following the introduction of conductive material posts connected to the lands or pads of the ultimate conductive material layers on opposite sides of the structure.

FIG. 13 shows the structure of FIG. 12 following the introduction of conductive material posts through the openings in sacrificial material layer 296A and 296B. In one embodiment, posts 299A and posts 299B are a copper material introduced by an electrolytic plating process. Posts 299A and 299B are introduced to connect with lands of conductive layers 290A and 290B, respectively. A plurality of posts 299A and 299B on the body of the respective build-up carriers define a grid array (a metal grid array).

Figure 14:
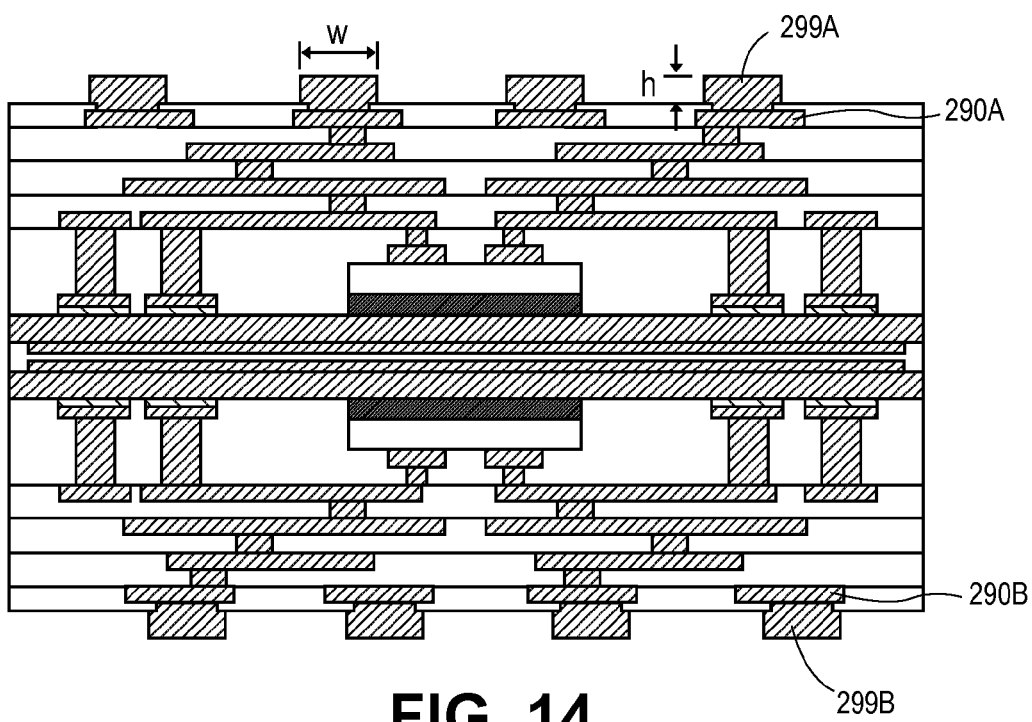
FIG. 14 shows the structure of FIG. 13 following the removal of the sacrificial material layers.

FIG. 14 shows the structure of FIG. 13 following a removal of sacrificial material layers 296A and 296B and portions of conductive material 295A and conductive material 295B by, for example, a chemical etching process. FIG.

14 shows the grid arrays of conductive posts 299A and 299B, respectively. As illustrated, in one embodiment, posts 299A and 299B have a width dimension, w, that is less than a width dimension of lands 290A and 290B and a height dimension, h, that is greater than a height dimension of lands 290A and 290B. In one embodiment, each of posts 299A and 299B have the same dimensions (w, h and depth). In another embodiment, various ones of posts 299A as well as various ones of posts 299B may have one or more different dimensions. Still further, posts 299A and 299B may have a variety of shapes, any shape being dependent at least in part on the shape of openings in sacrificial material layers 296A and 296B. Representative shapes include, but are not limited to, rectangular, including square (w, h, depth) and cylindrical (where w is a diameter). In one embodiment, representative dimensions for generally cylindrical posts include a diameter, w, on the order of 50 μm to 200 μm and a height, h, on the order of 50 μm to 100 μm.

Figure 15:
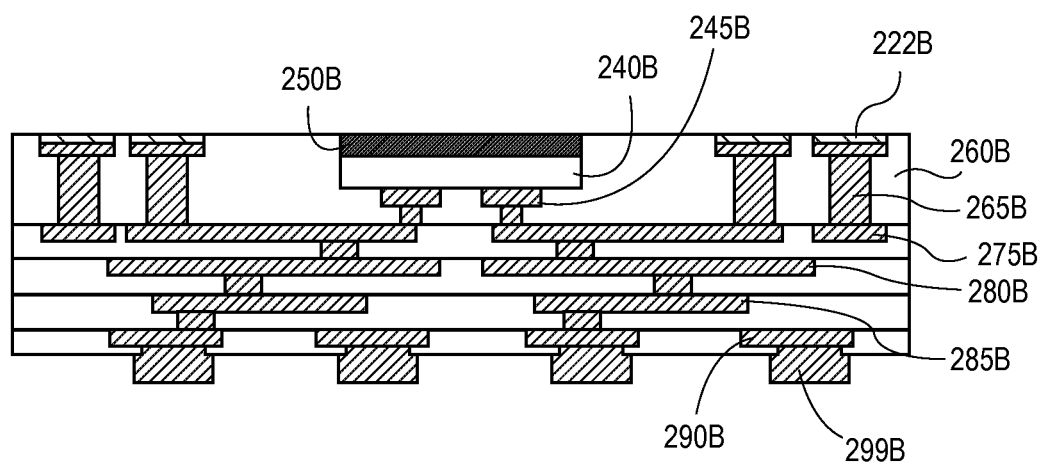
FIG. 15 shows the structure of FIG. 14 after separation of the structure into individual packages.

FIG. 15 shows a portion of the structure of FIG. 14 following the separation of the structure into two individual package portions by removal of sacrificial substrate 210 and copper foils 215A and 215B. By removing the individual package portions from sacrificial substrate 210, FIG. 15 shows a portion of a free standing microelectronic package that has a die connected at a device side to a build-up carrier including a number of alternating layers of electrically conductive material (four levels of conductive traces) and dielectric or insulating material. Conductive pillars 245B fabricated, for example, at the die fabrication process are connected to contact points on a device side of die 240B and are connected to the conductive material of the build-up carrier. The package also includes contact points 222B extending to a surface of the build-up carrier (upper surface as viewed) for electrical connection to a secondary device (e.g., memory device, logic device) or package (e.g., package containing one or more memory devices, logic devices, memory and logic devices, etc.). In another embodiment, the die may be a through silicon vias (TSV) die. Finally, the package includes a number of conductive posts extending from a second side (bottom side as viewed) that define a grid array (a metal grid array). The grid array may be directly connected to a printed circuit board through, for example, a solder connection. As illustrated above, the dimensions of posts 299B (e.g., width, diameter, height) are configurable as they are defined by a thickness of sacrificial material layer 296B and patterned openings (see FIGS. 12-14 and the accompanying text).

Figure 16:
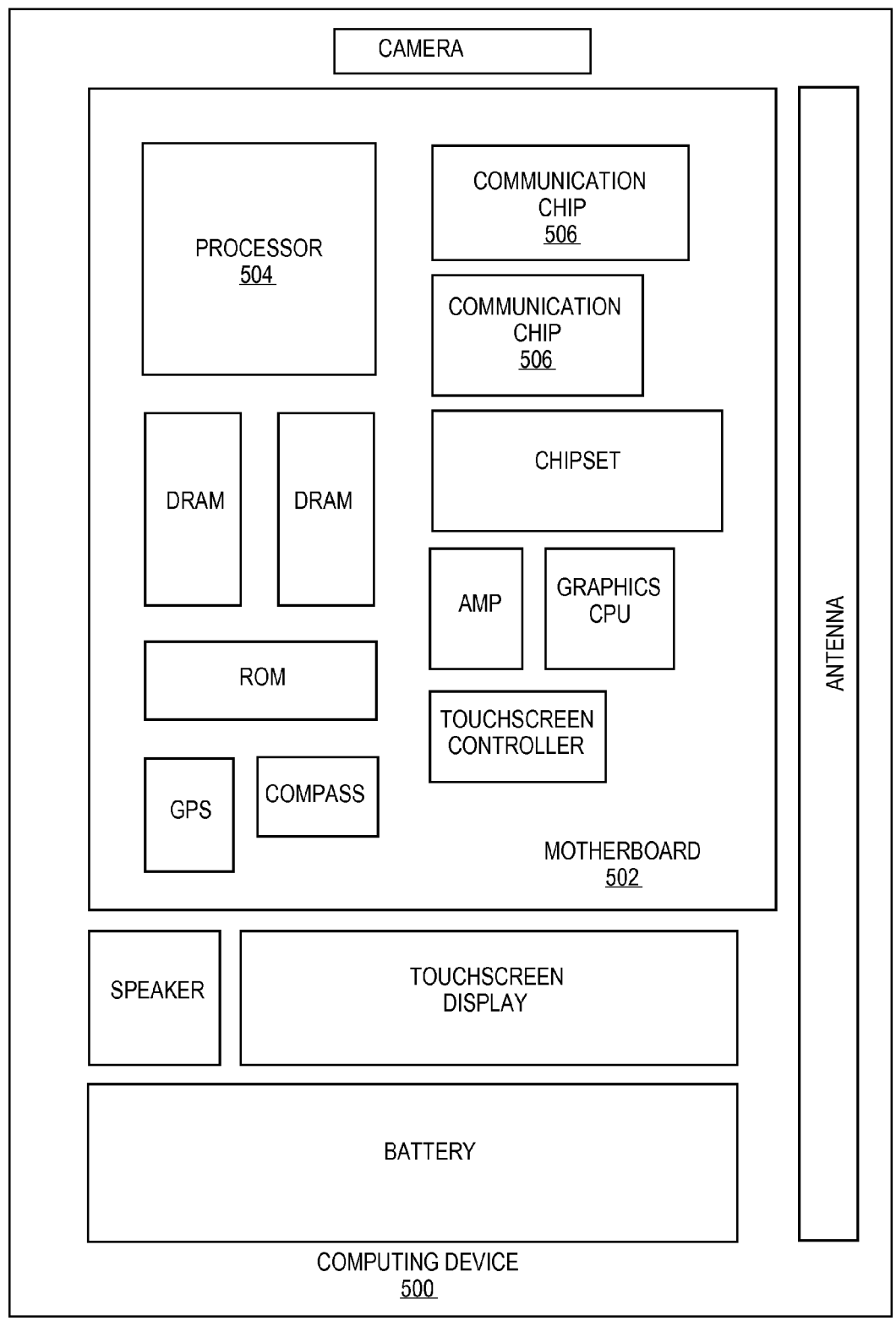
FIG. 16 illustrates a schematic illustration of a computing device.

FIG. 16 illustrates a computing device 500 in accordance with one implementation. Computing device 500 houses board 502. Board 502 may include a number of components, including but not limited to processor 504 and at least one communication chip 506. Processor 504 is physically and electrically coupled to board 502. In some implementations the at least one communication chip 506 is also physically and electrically coupled to board 502. In further implementations, communication chip 506 is part of processor 504.

Depending on its applications, computing device 500 may include other components that may or may not be physically and electrically coupled to board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. In some implementations, the package formed in accordance with embodiment described above utilizes BBUL technology with carrier including a body having a die embedded therein and a grid array of conductive posts attached to the body for connection to a circuit board. The term "processor" may refer to any device or portion of a device that processes electronic data from registers and/or memory to transform that electronic data into other electronic data that may be stored in registers and/or memory.

Communication chip 506 also includes an integrated circuit die packaged within communication chip 506. In accordance with another implementation, package is based on BBUL technology and incorporates a primary core surrounding a TSV or non-TSV integrated circuit die that inhibit package warpage. Such packaging will enable stacking of various devices, including but not limited to, a microprocessor chip (die) with a memory die with a graphics die with a chip set with GPS.

In further implementations, another component housed within computing device 500 may contain a microelectronic package that incorporates a primary BBUL carrier implementation such as described above.

In various implementations, computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the claims but to illustrate it. The scope of the claims is not to be determined by the specific examples provided above. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

The invention claimed is:

1. An apparatus comprising:
   a die comprising a first side and an opposite second side comprising a device side with contact points;
   an adhesive layer on the first side of the die;
   a build-up carrier comprising:
      a body comprising a plurality of alternating layers of conductive material and dielectric material disposed on the second side of the die, an ultimate layer of conductive material disposed furthest from the die and patterned into a plurality of pads;
      a grid array on a first side of the build-up carrier, the grid array comprising a plurality of posts each comprising a material that is the same as a material of the layers of conductive material of the body, the posts disposed on respective ones of the plurality of pads of the ultimate layer of conductive material of the body and extending through an ultimate layer of dielectric material defining a surface of the body, at least one of the posts coupled to at least one of the contact points of the die through at least a portion of the conductive material of the body, and the grid array operable to be directly connected to a printed circuit board; and
      a plurality of contacts on a second side of the build-up carrier, the plurality of contacts coupled to one or more of the layers of conductive material, wherein the adhesive layer and the second side of the build-up carrier define a surface and the plurality of contacts are on the surface of the build-up carrier.

2. The apparatus of claim 1, wherein the posts of the grid array comprise a height dimension of 50 microns to 100 microns.

3. The apparatus of claim 1, wherein a dimension of the plurality of posts of the grid array is configurable.

4. The apparatus of claim 1, wherein the body comprises a first side and a second side and the grid array is disposed on the first side of the body, the body further comprising a plurality of contact points on the first side and at least one of the plurality of posts of the grid array is coupled to at least one of the contact points of the body through at least a portion of the conductive material of the body.

5. The apparatus of claim 4, wherein the die comprises a first die, the apparatus further comprising a second die coupled to the second side of the body, wherein at least one of the plurality of posts of the grid array is coupled to a contact point of the second die.

6. The apparatus of claim 1, wherein each of the plurality of posts having a width dimension that is less than a width dimension of a respective pad.

7. An apparatus comprising:
   a package comprising a microprocessor disposed in a carrier,
   the microprocessor comprising a first side and an opposite second side comprising a device side with contact points, wherein an adhesive layer is disposed on the first side of the microprocessor;
   the carrier comprising:
      a body comprising a plurality of alternating layers of conductive material and dielectric material disposed on the second side of the microprocessor, an ultimate layer of conductive material defining a plurality of pads;
      a grid array on a first side of the body comprising a plurality of rectangular posts comprising a material that is the same as a material of the layers of conductive material of the body, the posts disposed on respective ones of the plurality of pads of the ultimate conductive layer of the body and extending through an ultimate layer of dielectric material defining a surface of the body, at least one of the posts coupled to at least one of the contact points of the die through at least a portion of the conductive material of the body;
      a plurality of contacts on a second side of the carrier, the plurality of contacts coupled to one or more of the layers of conductive material, wherein the adhesive layer and the second side of the build-up carrier define a surface and the plurality of contacts are on the surface of the carrier; and
   a printed circuit board coupled to at least a portion of the plurality of conductive posts of the grid array.

8. The apparatus of claim 7, wherein the body comprises a first side and a second side and the grid array is disposed on the first side of the body, the body further comprising a plurality of contact points on the first side and at least one of the plurality of posts of the grid array is coupled to at least one of the contact points of the body through at least a portion of the conductive material of the body.

9. The apparatus of claim 8, further comprising:
   a secondary device coupled to the at least one of the plurality of contacts on the first side of the body.

10. The apparatus of claim 9, wherein the secondary device comprises at least one memory device.

11. The apparatus of claim 7, wherein the posts of the grid array comprise a height dimension of 50 microns to 100 microns.

12. The apparatus of claim 7, wherein each of the plurality of posts having a width dimension that is less than a width dimension of a respective pad.

* * * * *